(12) United States Patent
Xiao

(10) Patent No.: US 12,025,385 B2
(45) Date of Patent: *Jul. 2, 2024

(54) LIQUID COOLING DEVICE WITH WATER TANK STRUCTURE

(71) Applicant: SHENZHEN APALTEK CO., LTD., Shenzhen (CN)

(72) Inventor: Qineng Xiao, Guangdong (CN)

(73) Assignee: SHENZHEN APALTEK CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/831,408

(22) Filed: Jun. 2, 2022

(65) Prior Publication Data

US 2022/0290930 A1 Sep. 15, 2022

Related U.S. Application Data

(62) Division of application No. 16/909,959, filed on Jun. 23, 2020, now Pat. No. 11,391,520.

(30) Foreign Application Priority Data

Aug. 13, 2019 (CN) .......................... 201910744755.5

(51) Int. Cl.
*F28F 1/30* (2006.01)
*F28F 9/02* (2006.01)
(Continued)

(52) U.S. Cl.
CPC .............. *F28F 1/30* (2013.01); *F28F 9/0202* (2013.01); *F28F 2250/08* (2013.01);
(Continued)

(58) Field of Classification Search
CPC .......... H05K 7/20218; H05K 7/20254; H05K 7/20263; H05K 7/20272; H01L 23/473; F28F 2250/08; F28F 1/30; F28F 9/0202
See application file for complete search history.

(56) References Cited

U.S. PATENT DOCUMENTS

| 5,161,089 A | * | 11/1992 | Chu | .................... | H01L 23/4338 |
| | | | | | 257/E23.098 |
| 6,430,945 B1 | * | 8/2002 | Haussmann | ......... | B60H 1/3227 |
| | | | | | 62/509 |

(Continued)

*Primary Examiner* — Paul Alvare
(74) *Attorney, Agent, or Firm* — Chun-Ming Shih; HDLS IPR SERVICES

(57) ABSTRACT

A liquid cooling device includes a water tank structure having parallel and separated first and second water tanks. The heat dissipation structure is installed between the first and second water tanks and the three are coupled to each other to form a curved cooling water passage. A mounting portion is formed in the gap between the heat dissipation structure and the first and second water tanks in the extension direction of the heat dissipation structure and the first and second water tanks. Both of the pumping structure and the endothermic structure are coupled to the first and second water tanks. The pumping structure and the endothermic structure are installed in at least one mounting portion and the pumping structure drives a working fluid to flow back and forth between the first water tank, the heat dissipation structure and the second water tank in the curved cooling water passage sequentially.

2 Claims, 19 Drawing Sheets

(51) Int. Cl.
   *H01L 23/473*   (2006.01)
   *H05K 7/20*   (2006.01)
(52) U.S. Cl.
   CPC ........ *H01L 23/473* (2013.01); *H05K 7/20218* (2013.01); *H05K 7/20254* (2013.01); *H05K 7/20272* (2013.01)

(56) References Cited

U.S. PATENT DOCUMENTS

| | | | |
|---|---|---|---|
| 10,697,704 B2* | 6/2020 | Xiao | F28D 1/024 |
| 11,109,510 B2* | 8/2021 | Nakae | H05K 7/20272 |
| 2006/0185829 A1* | 8/2006 | Duan | H01L 23/473 |
| | | | 257/E23.098 |
| 2007/0034353 A1* | 2/2007 | Liu | H01L 23/473 |
| | | | 361/698 |
| 2007/0034359 A1* | 2/2007 | Liu | F28D 1/05366 |
| | | | 165/104.31 |
| 2007/0103869 A1* | 5/2007 | Liu | H01L 23/473 |
| | | | 257/E23.098 |
| 2008/0023186 A1* | 1/2008 | Beamer | F28D 1/05375 |
| | | | 165/174 |
| 2019/0090384 A1* | 3/2019 | Xiao | F28F 1/126 |

* cited by examiner

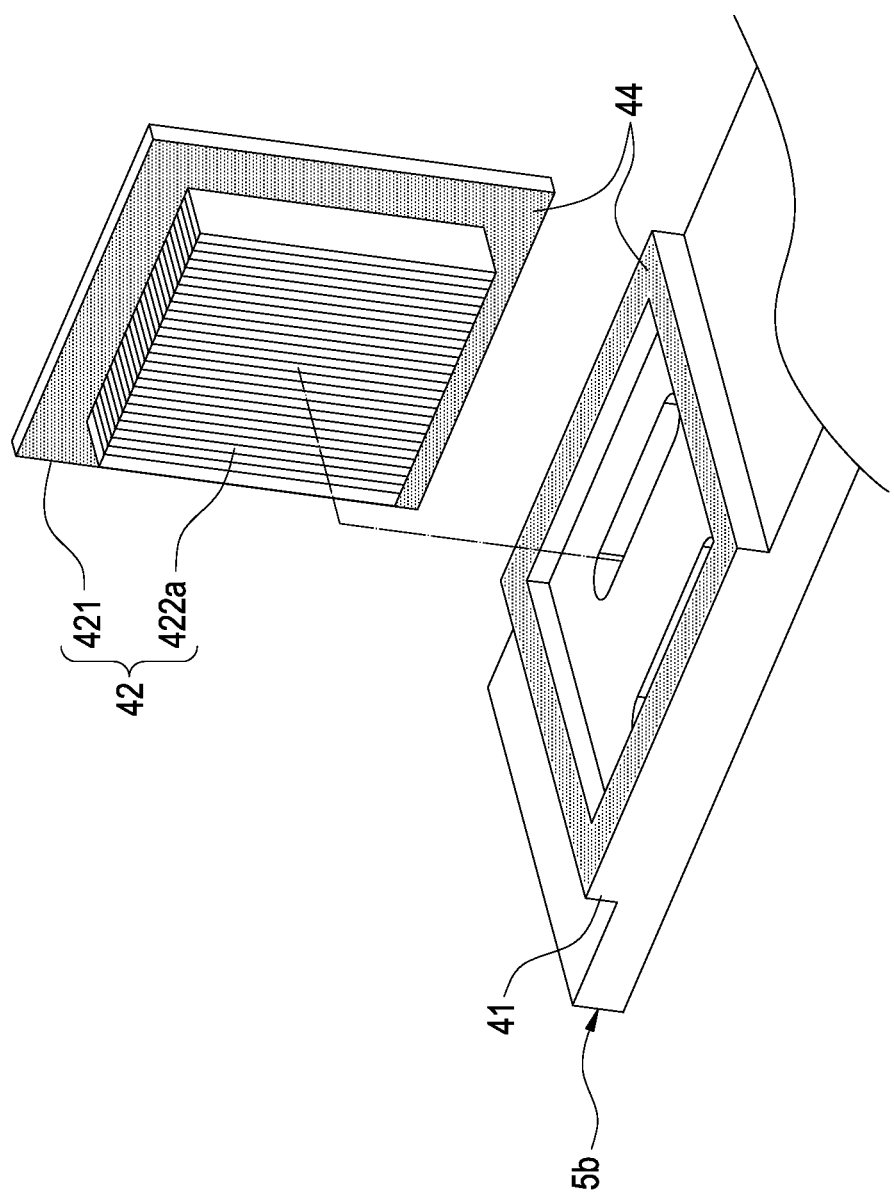

LIQUID COOLING DEVICE WITH WATER TANK STRUCTURE

CROSS-REFERENCE TO RELATED APPLICATION

The present application is a divisional application of U.S. Ser. No. 16/909,959 filed on Jun. 23, 2020. The entire disclosures of the above applications are all incorporated herein by reference.

BACKGROUND OF THE INVENTION

Technical Field

The technical field of this disclosure relates to heat sinks, and more particularly to a liquid cooling device.

Description of Related Art

In general, a conventional liquid cooling device comprises a water chamber, a water pump, an endothermic block, and a radiator and has the effect of using a water pump to drive a working fluid to flow, so that the circulation of the working fluid can dissipate the heat of a heat source and achieve a liquid cooling effect.

However, the water tank, the water pump and the endothermic block of the conventional liquid cooling device are connected by long hoses and connectors, and the joint between the hose and the connector becomes a high-risk point of leaking the working fluid, and the complicated structure causes a substantially larger volume that usually cannot meet the application in a small space.

Secondly, the conventional liquid cooling device is generally manufactured by a specific mold, and the specific mold is limited to produce a specific product only but it is unable to freely select and change the positions of the water pump and the endothermic device according to the using environments and requirements. For example, the position of a heat source varies in different products. Since the endothermic block of the conventional liquid cooling device is fixed, therefore the required position cannot be selected or adjusted freely. On the other hand, the conventional liquid cooling device does not allow users to expand or add more water pumps or endothermic blocks to cope with different using environments.

In view of the aforementioned drawbacks of the prior art, the discloser of this disclosure based on years of experience in the related industry to conduct extensive research and experiment, and finally provided a feasible solution to overcome the drawbacks of the prior art.

SUMMARY OF THE INVENTION

Therefore, it is a primary object of this disclosure to provide a liquid cooling device with a compact structure and reduced volume.

To achieve the aforementioned and other objectives, this disclosure discloses a liquid cooling device, comprising: a water tank structure, having a first water tank and a second water tank for storing and dispatching a working fluid of the liquid cooling device; a heat dissipation structure, installed between the first water tank and the second water tank and coupled to each other to form a curved cooling water passage, and the heat dissipation structure being provided for exchanging heat absorbed by the working fluid with the outside to dissipate the heat; a mounting portion, formed at a gap between the heat dissipation structure and the first water tank and the second water tank, and formed side-by-side in an extending direction of the heat dissipation structure and the first water tank and the second water tank; a pumping structure, coupled to the first water tank and the second water tank; and an endothermic structure, coupled to the first water tank and the second water tank; wherein the pumping structure and the endothermic structure are installed in the at least one mounting portion, and the pumping structure drives the working fluid to flow back and forth between the first water tank, the heat dissipation structure and the second water tank sequentially in the curved cooling water passage.

BRIEF DESCRIPTION OF THE DRAWINGS

FIGS. 8A, 8B, and 8C are schematic views showing an endothermic structure with different types of heat absorbers in accordance with the first embodiment of the present disclosure respectively;

DESCRIPTION OF THE PREFERRED EMBODIMENTS

The technical contents of this disclosure will become apparent with the detailed description of preferred embodiments accompanied with the illustration of related drawings as follows. It is intended that the embodiments and drawings disclosed herein are to be considered illustrative rather than restrictive.

Figure 10A:
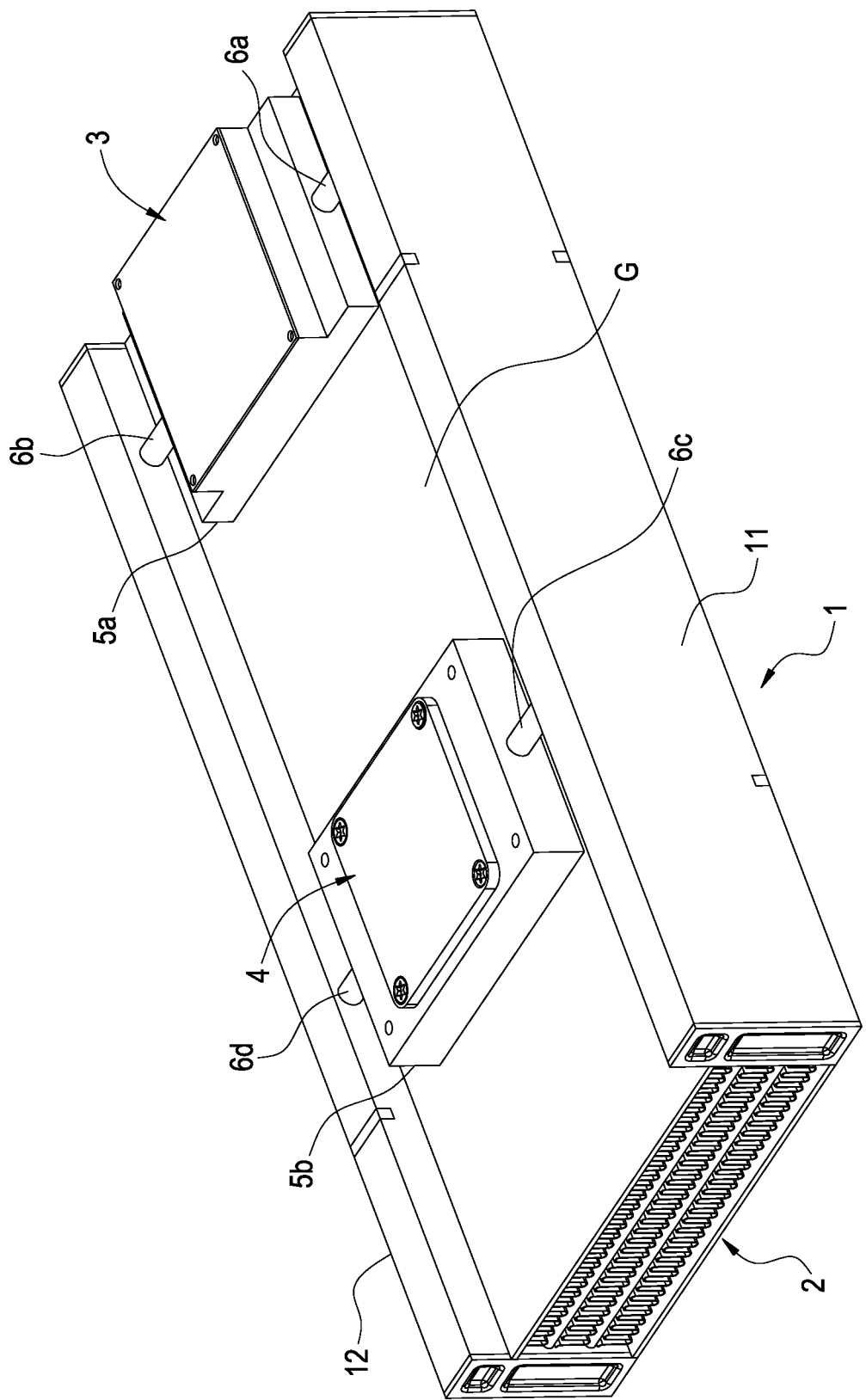
FIGS. 10A and 10B are perspective views of a liquid cooling device in accordance with a second embodiment of the present disclosure.
Figure 10B:
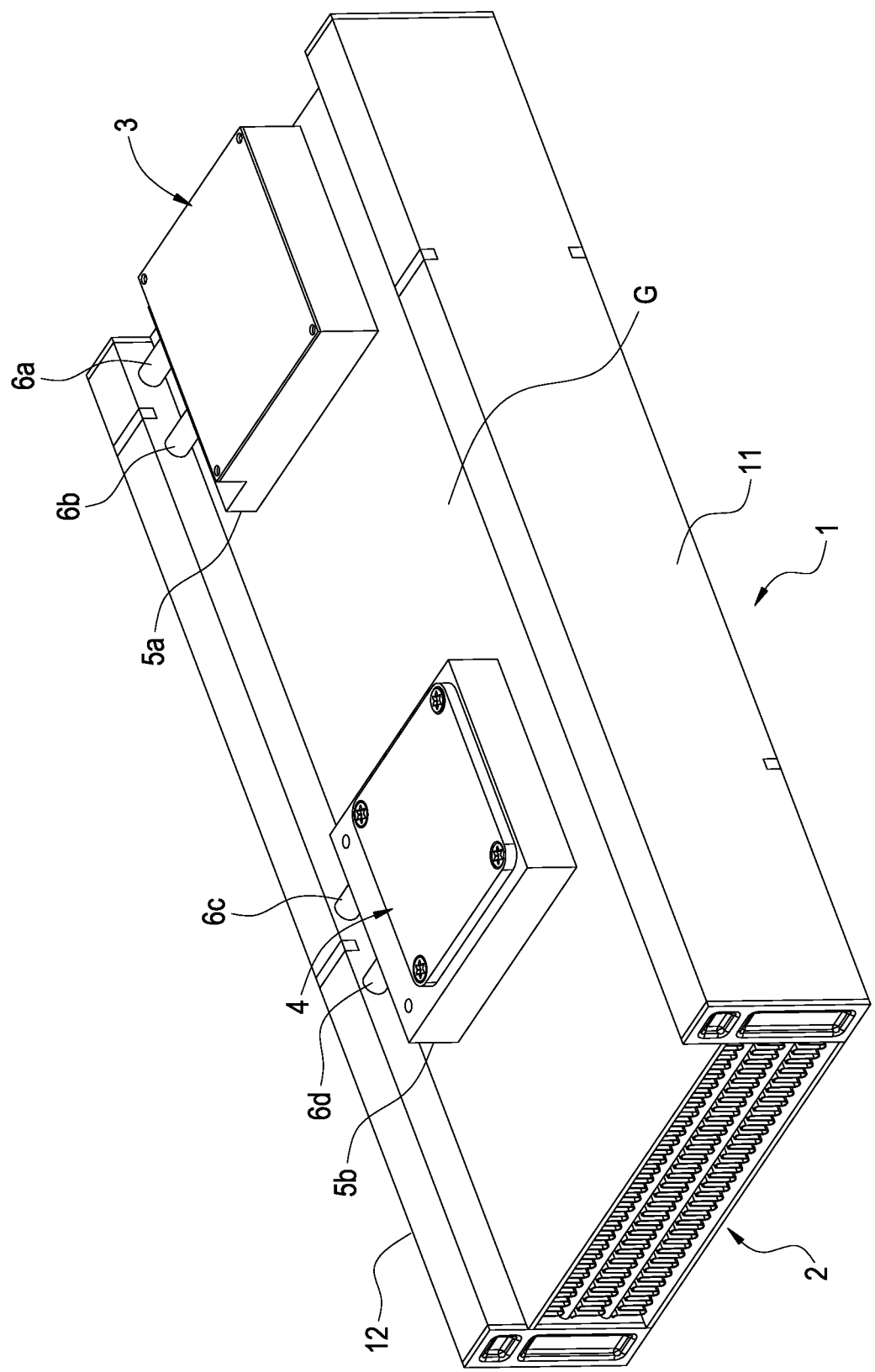
Figure 11:
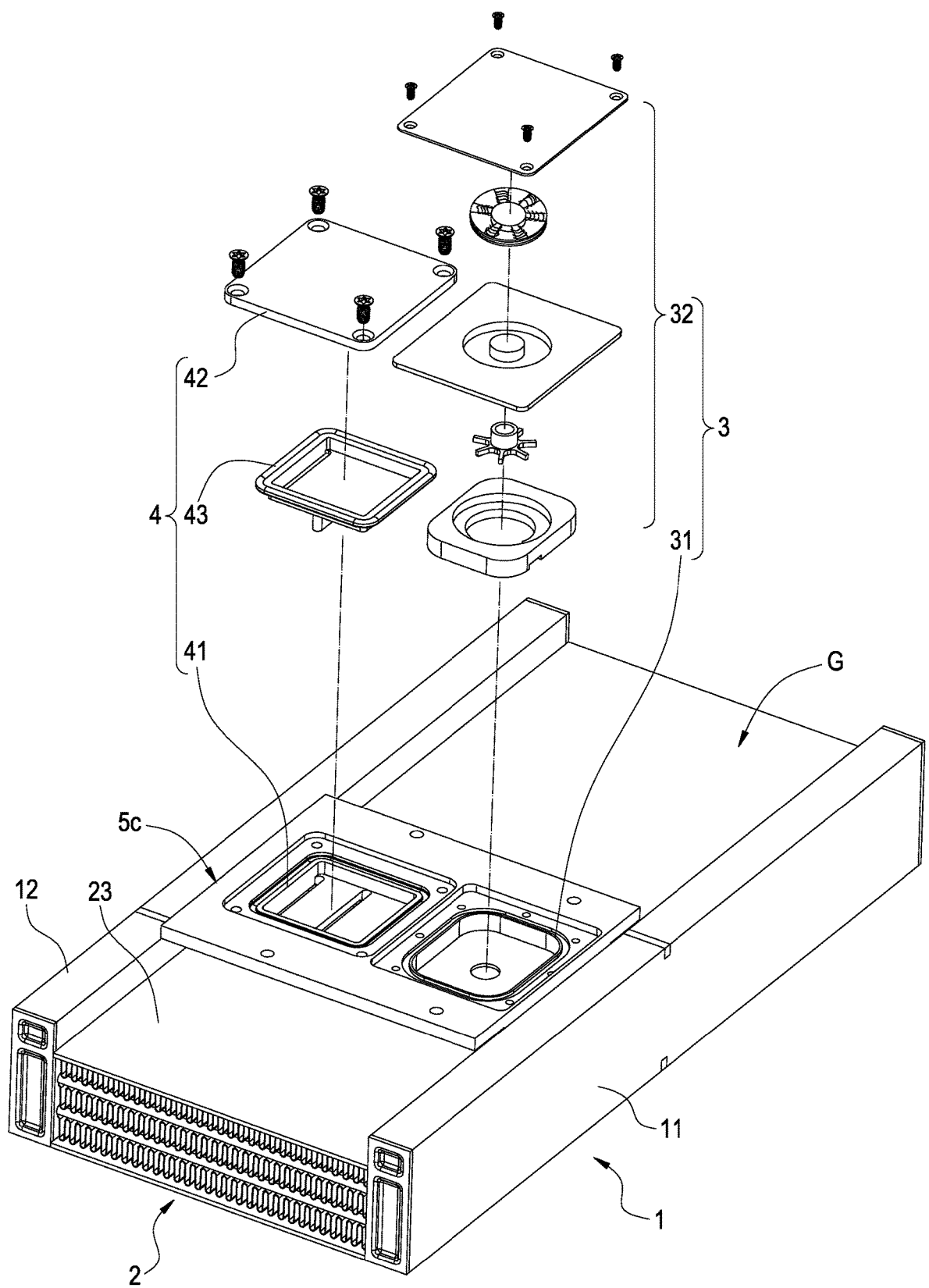
FIG. 11 is an exploded view of a liquid cooling device in accordance with a third embodiment of the present disclosure.
Figure 12:
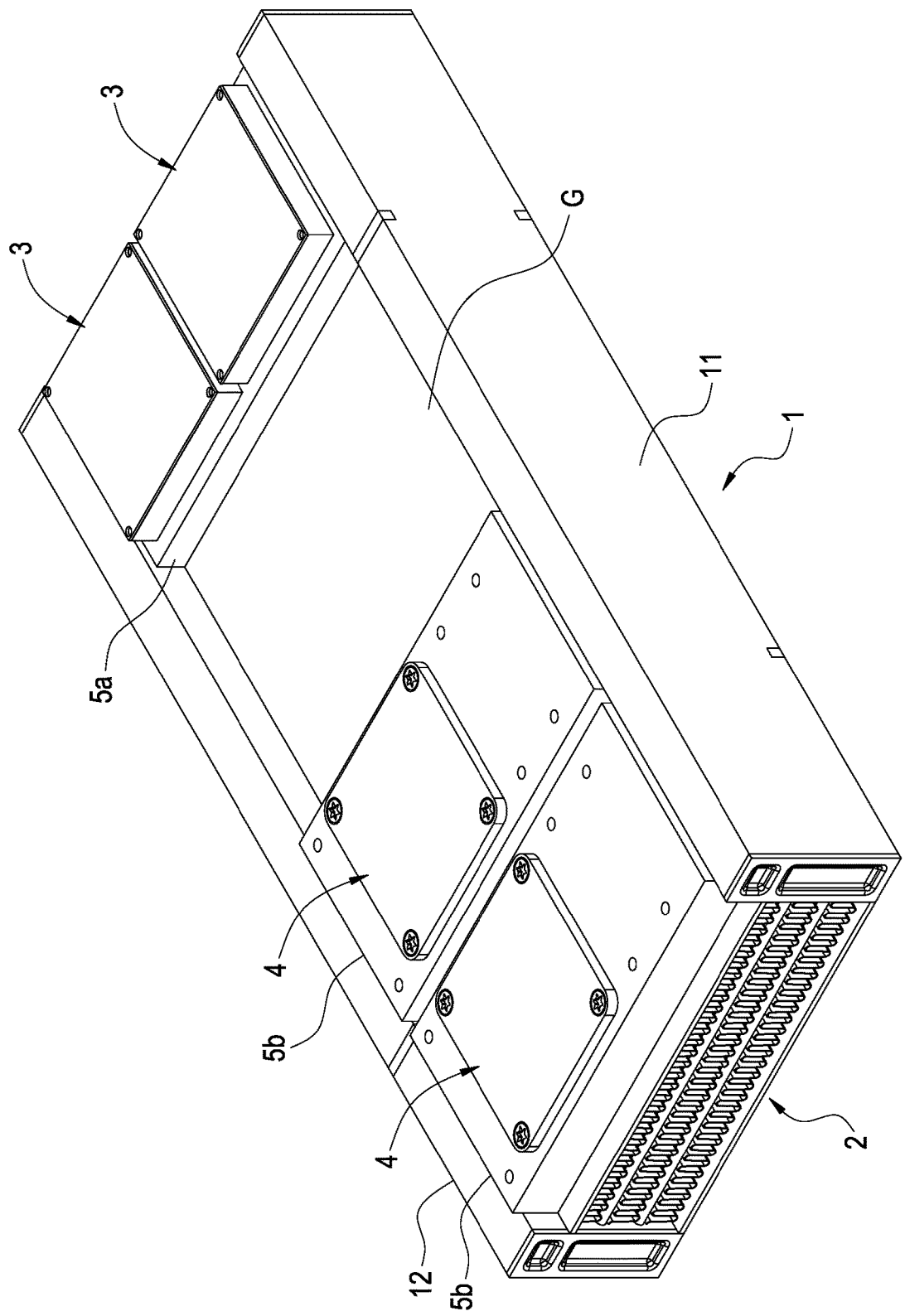
FIG. 12 is a perspective view of a liquid cooling device in accordance with a fourth embodiment of the present disclosure.

The present disclosure directs to a liquid cooling device capable of dissipating the heat of a heat source by a working fluid, wherein FIGS. 1 to 9 show the first embodiment, and FIGS. 10 to 12 show the second, third, and fourth embodiment of the present disclosure respectively.

Figure 1:
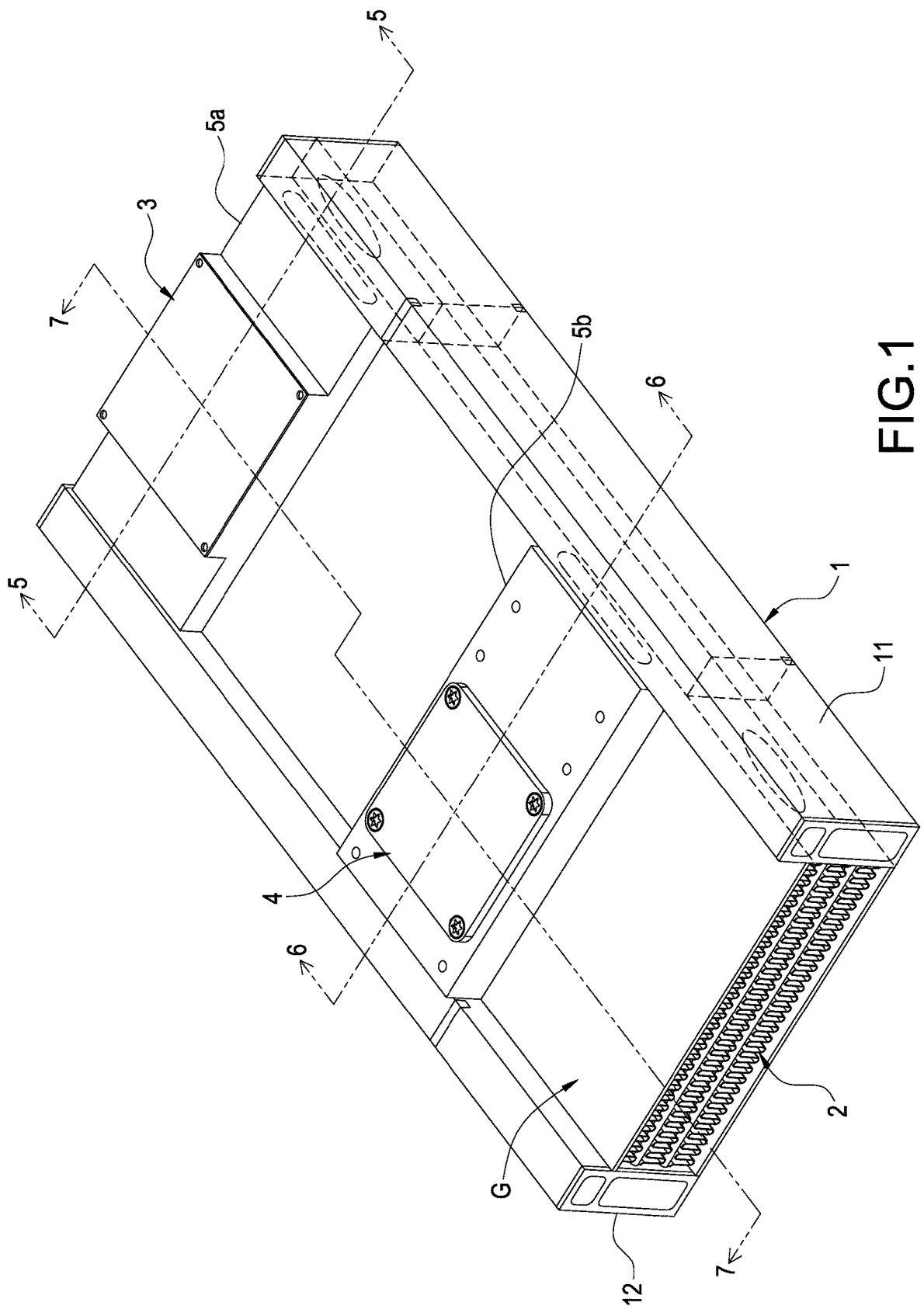
FIG. 1 is a perspective view of a liquid cooling device in accordance with a first embodiment of this disclosure.
Figure 2:
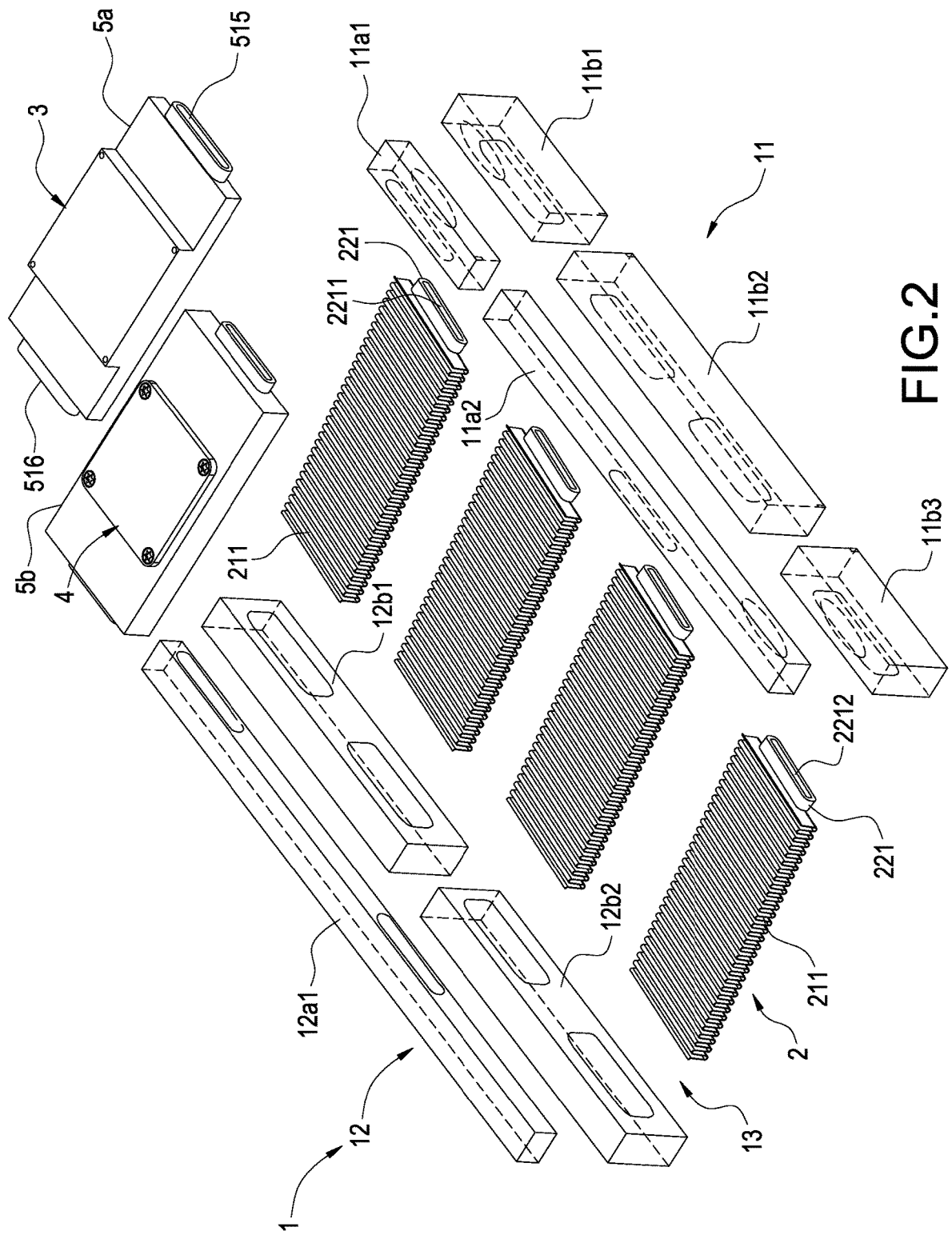
FIG. 2 is a partial exploded view showing a simple water tank structure and a heat dissipation structure in accordance with the first embodiment of the present disclosure showing.

In FIGS. 1 and 2, the liquid cooling device of the first embodiment of the present disclosure comprises a water tank structure 1, a heat dissipation structure 2, a pumping structure 3 and an endothermic structure 4 and preferably further comprises a first bridge 5a and a second bridge 5b.

The water tank structure 1 comprises a first water tank 11 and a second water tank 12 arranged side by side with each other and having an interval apart from each other. A partitioned space 13 is defined between the first water tank 11 and the second water tank 12, wherein the first water tank 11 and the second water tank 12 are provided for storing and dispatching a working fluid of the liquid cooling device of the present disclosure, so as to ensure the normal operation and cooling function of the liquid cooling device.

The heat dissipation structure 2 is installed in the partitioned space 13 and coupled to the first water tank 11 and the second water tank 12. In this embodiment, the first water tank 11 and the second water tank 12 are disposed on both sides of the heat dissipation structure 2 respectively. A mounting portion G is formed at the gap between the the heat dissipation structure 2 and the first water tank 11 and the second water tank 12.

In this disclosure, the formation of the mounting portion G is not limited to the one as described above. In this embodiment, the mounting portion G is formed between the inner side of the first water tank 11, the inner side of the second water tank 12 and a side of the heat dissipation structure 2.

Both of the pumping structure 3 and the endothermic structure 4 are disposed in the mounting portion G, and the pumping structure 3 is coupled to the first water tank 11 and the second water tank 12, and the endothermic structure 4 is coupled to the first water tank 11 and the second water tank 12. In this embodiment, the pumping structure 3 and the endothermic structure 4 are disposed on the same side of the heat dissipation structure, and the mounting portion G has an area greater than the sum of the area of the pumping structure 3 and the area of the endothermic structure 4 as shown in FIG. 1.

Since the pumping structure 3 and the endothermic structure 4 are disposed in the mounting portion G and the mounting portion G has a remaining space for installing the pumping structure 3 and the endothermic structure 4, therefore the installation positions of the pumping structure 3 and the endothermic structure 4 in the mounting portion G can be adjusted freely according to the actual using environment, before the pumping structure 3 and the endothermic structure 4 and the first water tank 11 or the second water tank 12 are installed to their respective positions; and this disclosure has the effect of preventing the pumping structure 3 and the endothermic structure 4 from interfering with each other.

In addition, the first water tank 11 and the second water tank 12 are elongated cuboids, and the heat dissipation structure 2 is an oblong cuboid, so that the mounting portion G becomes an oblong rectangular space. Further, the pumping structure 3 and the endothermic structure 4 are small cuboid for receiving the oblong rectangular space, so that the water tank structure 1, the heat dissipation structure 2, the pumping structure 3 and the endothermic structure 4 can be stacked longitudinally and combined transversally like blocks, and the present disclosure provides a compact liquid cooling device with the effect of reducing the total volume.

The water tank structure 1 and the heat dissipation structure 2 are simple structures as shown in FIG. 2 and described below.

The simple first water tank 11 has a plurality of first upper water chambers 11a1, 11a2 and a plurality of first lower water chambers 11b1, 11b2, 11b3, and the water chambers of the first water tank 11 can be stacked longitudinally and combined transversally like blocks, so that an elongated rectangular first water tank 11 can be formed in the fixed volume of the water tank to obtain the largest fluid volume. Wherein, the first upper water chamber 11a1 and the first lower water chamber 11b1 are vertically coupled to each other, and the first upper water chamber 11a2 and the first lower water chamber 11b3 are vertically coupled to each other. The simple second water tank 12 has a second upper water chamber 12a1 and a plurality of second lower water chambers 12b1, 12b2 formed therein, and the water chambers of the second water tank 12 can also be stacked vertically and combined transversally like blocks, so that an elongated rectangular second water tank 12 can be formed in the fixed volume of the water tank to obtain the largest fluid volume. The pumping structure 3 is coupled between the first upper water chamber 11a1 and the second upper water chamber 12a1, and the endothermic structure 4 is coupled between the first upper water chamber 11a2 and the second upper water chamber 12a1, and the heat dissipation structure 2 is coupled between each first lower water chamber 11b1, 11b2, 11b3 and each second lower water chamber 12b1, 12b2.

The simple heat dissipation structure 2 of another embodiment (not shown in the figure) is an oblong rectangular single-piece object, and each of the two sides of the simple heat dissipation structure 2 is coupled to the plurality of first lower water chambers 11b1, 11b2, 11b3 and the plurality of second lower water chambers 12b1, 12b2 through a plurality of interfaces respectively. In FIG. 2, the simple heat dissipation structure 2 can be formed by a plurality of cooling members 211 arranged side by side with each other, and each cooling member 211 is equipped with a fluid pipe 221, and each fluid pipe 221 is coupled to the first lower water chamber 11b1, 11b2, 11b3 and the second lower water chamber 12b1, 12b2.

In FIG. 2, the liquid cooling device of the present disclosure comprises a plurality of curved water passages which will be described in details below. A first curved water passage (not labeled in the figure) is formed along a path from a pump outlet 515 of the pumping structure 3, the first upper water chamber 11a1, and the first lower water chamber 11b1 coupled to the first upper water chamber 11a1 to a cooling liquid inlet 2211 of the heat dissipation structure 2, and the cooling liquid inlet 2211 is defined at a liquid inlet of the first cooling member 211 of the plurality of parallel cooling members 211. A second curved water passage (not labeled in the figure) is formed along a path from a cooling liquid outlet 2212 of the heat dissipation structure 2, the first lower water chamber 11b3, the first upper water chamber 11a2 coupled to the cooling liquid outlet 2112, the endothermic structure 4, and the second upper water chamber 12a1 to a pump inlet 516 of the pumping structure 3 coupled to the second upper water chamber 12a1, and the cooling liquid outlet 2212 is defined at a liquid outlet of the last cooling member 211 of the plurality of parallel cooling members 211. The working fluid in the pumping structure 3 is driven by the pumping structure 3 to curvedly flow back and forth between the plurality of first lower water chambers 11*b*1, 11*b*2, 11*b*3, the plurality of fluid pipes 221 and the plurality of second lower water chambers 12*b*1, 12*b*2 to define a curved cooling water passage (not labeled in the figure). In a preferred embodiment, the curved cooling water passage is bent to at least one S-shape and coupled between the first curved water passage and the second curved water passage.

Figure 3:
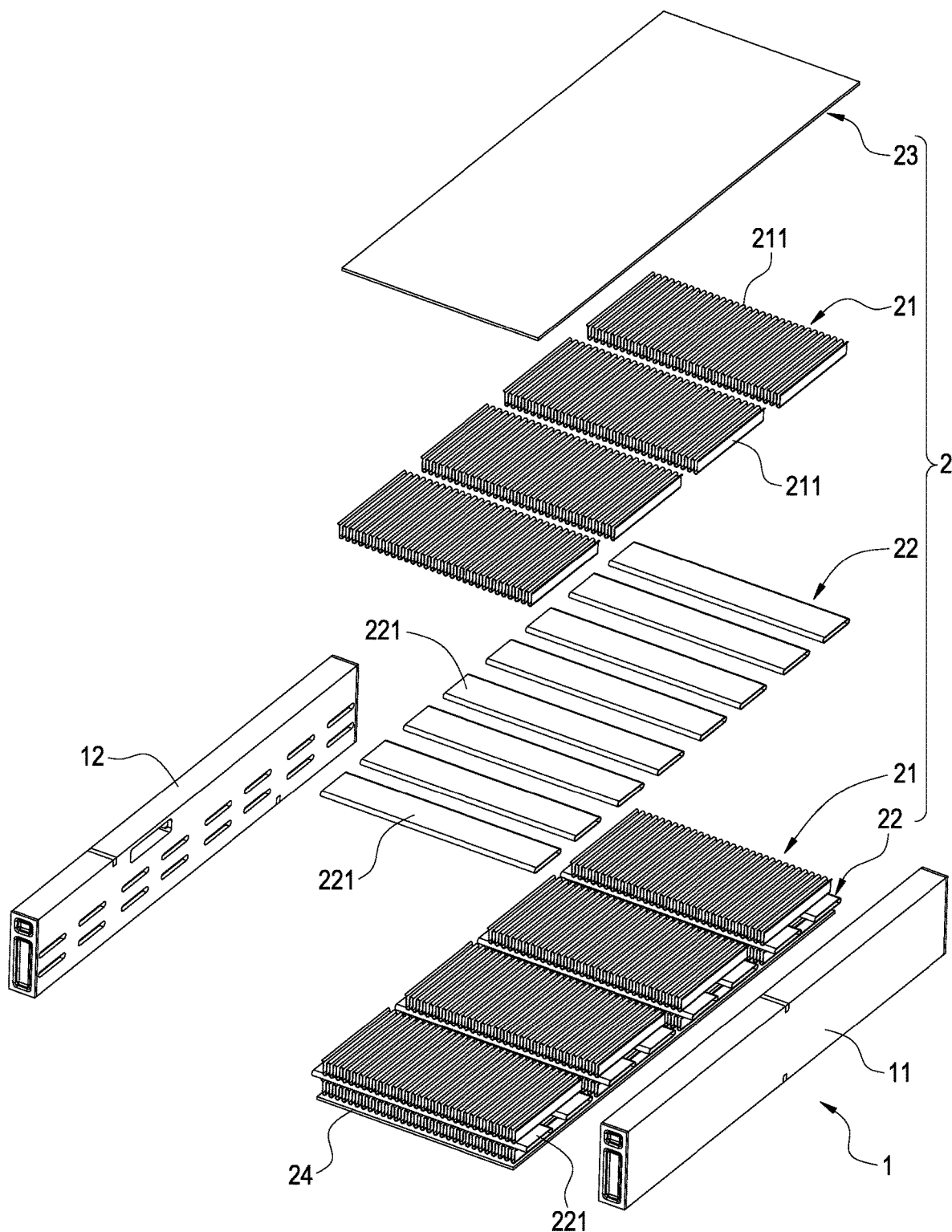
FIG. 3 is a partial exploded view showing a complex water tank structure and a heat dissipation structure in accordance with the first embodiment of the present disclosure.
Figure 5:
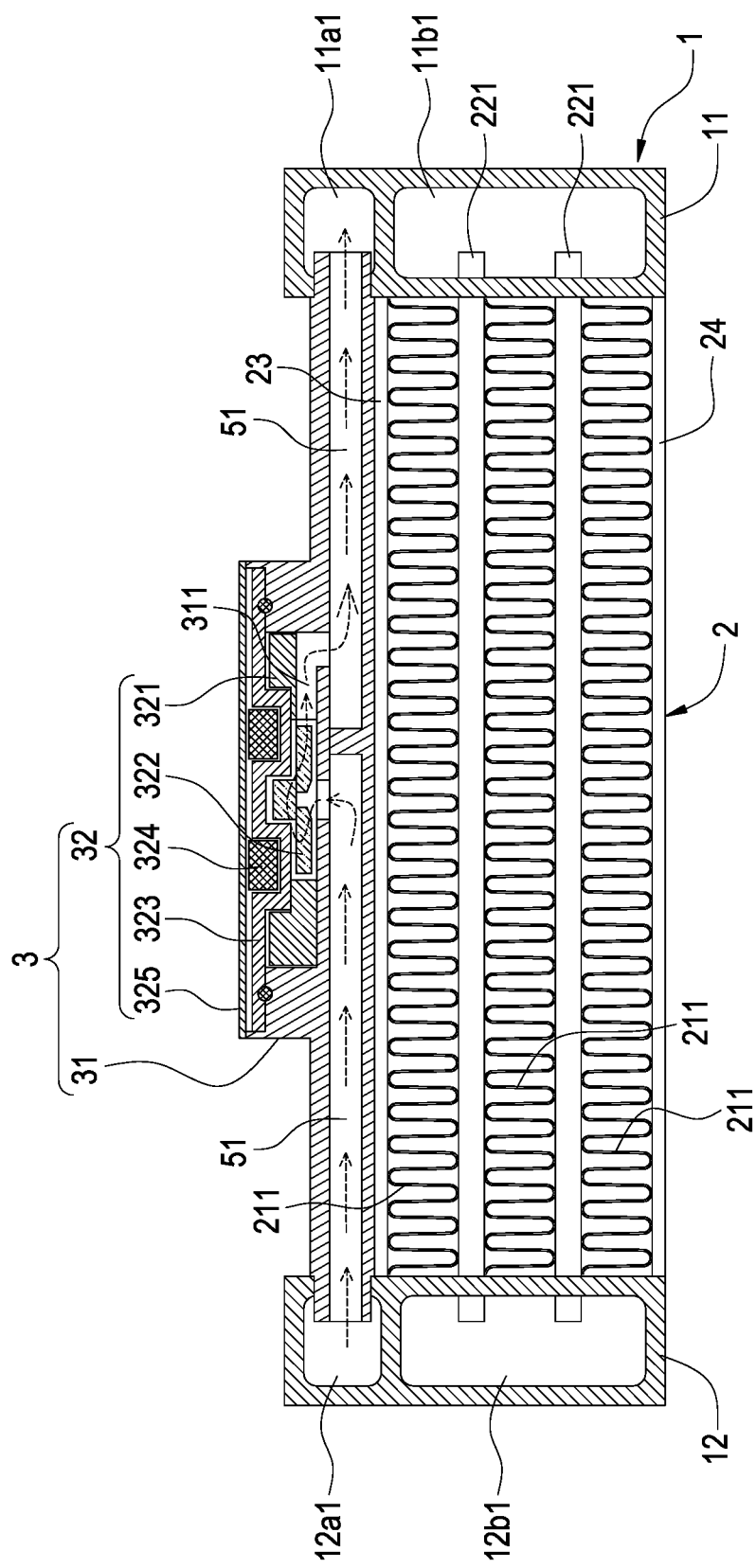
FIG. 5 is a cross-sectional view of Section 5-5 of FIG. 1.
Figure 6:
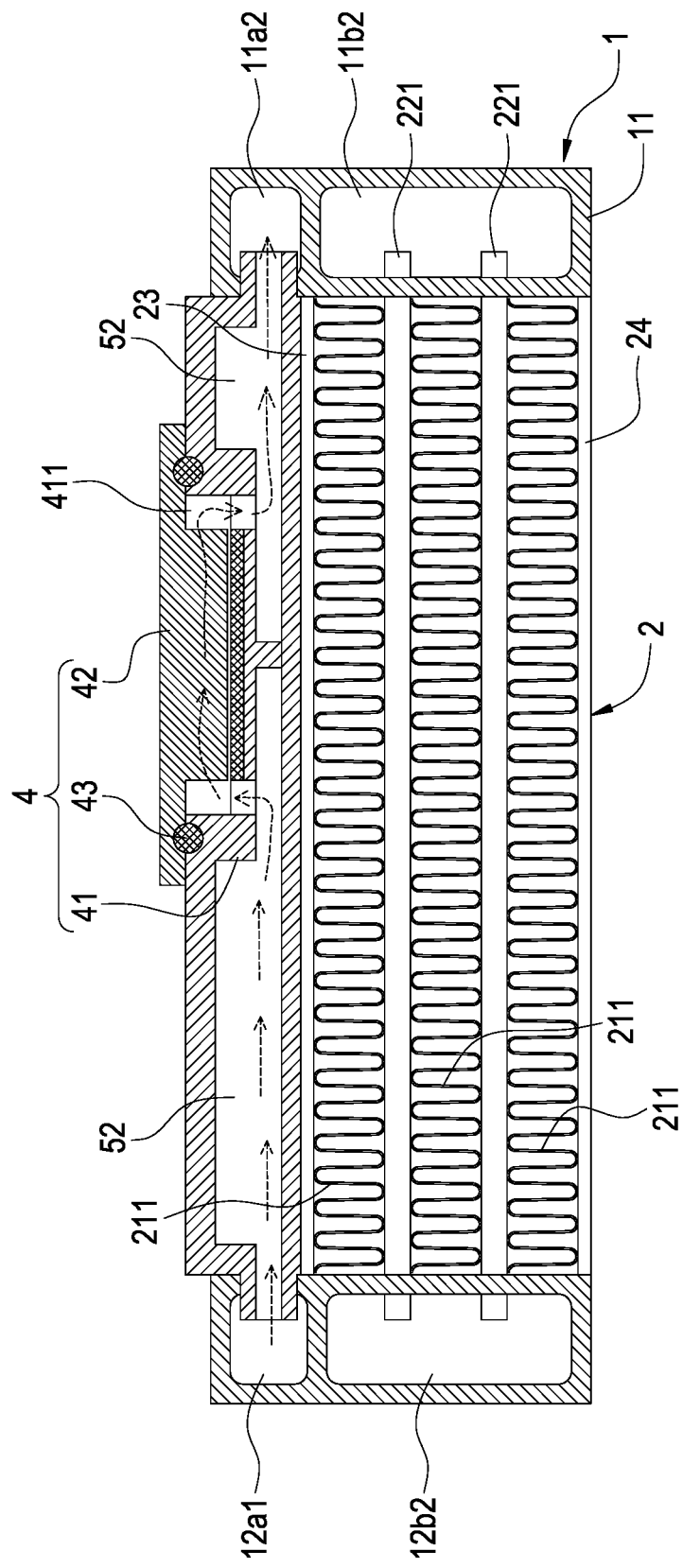
FIG. 6 is a cross-sectional view of Section 6-6 of FIG. 1.
Figure 7:
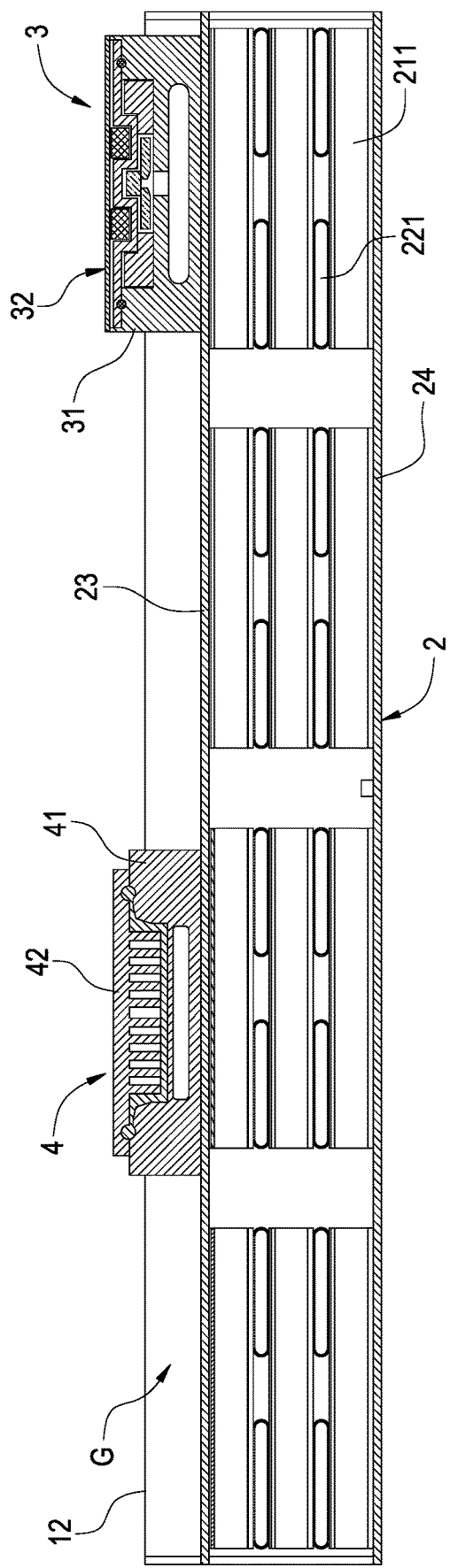
FIG. 7 is a cross-sectional view of Section 7-7 of FIG. 1.

FIG. 3 shows a complex heat dissipation structure 2, and the details will be described below. The heat dissipation structure 2 comprises a top cover 23, a row of fluid pipes 22, two rows of cooling members 21 and a bottom cover 24, and the row of fluid pipes 22 comprises a plurality of fluid pipes 221 arranged side by side with each other, and each row of cooling members 21 comprises a plurality of cooling members 211 arranged side by side with each other. In FIG. 5, both of the upper and lower sides of the row of fluid pipes 22 together with the top cover 23 and the bottom cover 24 are provided for clamping between two rows of cooling members 21. In a preferred embodiment, there are two rows of fluid pipes 22 and three rows of cooling members 21 which are clamped by different ways (as shown in FIG. 5).

In FIG. 3, the complex water tank structure 1 fits the two rows of fluid pipes 22 of the complex heat dissipation structure 2, and there are two rows of interfaces at the position of each lower water chamber. In other words, there is one more row of interfaces at the position of each lower water chamber of the simple water tank structure 1.

In FIGS. 4 to 7, the pumping structure 3 comprises a water pump seat 31 and a water pump 32 combined with each other, and the water pump 32 is coupled to the first water tank 11 and the second water tank 12 through the water pump seat 31. In a preferred embodiment, the water pump seat 31 of the pumping structure 3 can be coupled to the water tank structure 1 through the first bridge 5*a*. Both ends of the first bridge 5*a* are coupled to the first water tank 11 and the second water tank 12, and the first bridge 5*a* has a first port (not labeled in the figure), and the pumping structure 3 is configured to be corresponsive to and coupled to the first port by the water pump seat 31. For example, the water pump seat 31 is integrally formed with the first bridge 5*a*, but this disclosure is not limited to such arrangement only.

The endothermic structure 4 comprises an endothermic base 41 and a heat absorber 42 combined with each other, and the heat absorber 42 is coupled to the first water tank 11 and the second water tank 12 through the endothermic base 41. In a preferred embodiment, the endothermic structure 4 is coupled to the water tank structure 1 through the second bridge 5*b*. Both ends of the second bridge 5*b* are also coupled to the first water tank 11 and the second water tank 12, and the second bridge 5*b* has a second port (not labeled in the figure), and the endothermic structure 4 is configured to be corresponsive to and coupled to the second port by the endothermic base 41. For example, the endothermic base 41 is integrally formed with the second bridge 5*b*, but this disclosure is not limited to such arrangement only.

In detail, the water pump seat 31 has a pump chamber 311 formed therein and configured to be corresponsive to the first port, and the first bridge 5*a* has two first chambers 51 horizontally separated from each other, and the pump chamber 311 is coupled between the two first chambers 51 and bent vertically up and down, so as to provide the effects of changing the flowing direction and increasing the kinetic energy for driving the flow of the working fluid.

The endothermic structure 4 has an endothermic chamber 411 configured to be corresponsive to the second port, and the second bridge 5*b* has two second chambers 52 horizontally separated from each other, and the endothermic chamber 411 is coupled between the two second chambers 52 and bent vertically up and down, so as to provide the effects of changing the flowing direction and reducing the flow rate to improve the heat exchange capacity.

It is noteworthy that the pumping structure 3 is disposed at the installation position of the first bridge 5*a* and the endothermic structure 4 is disposed at the installation position of the second bridge 5*b*, and these positions can be adjusted according to the required using environment. Therefore, this disclosure has more flexibility to make adjustment freely.

Figure 4:
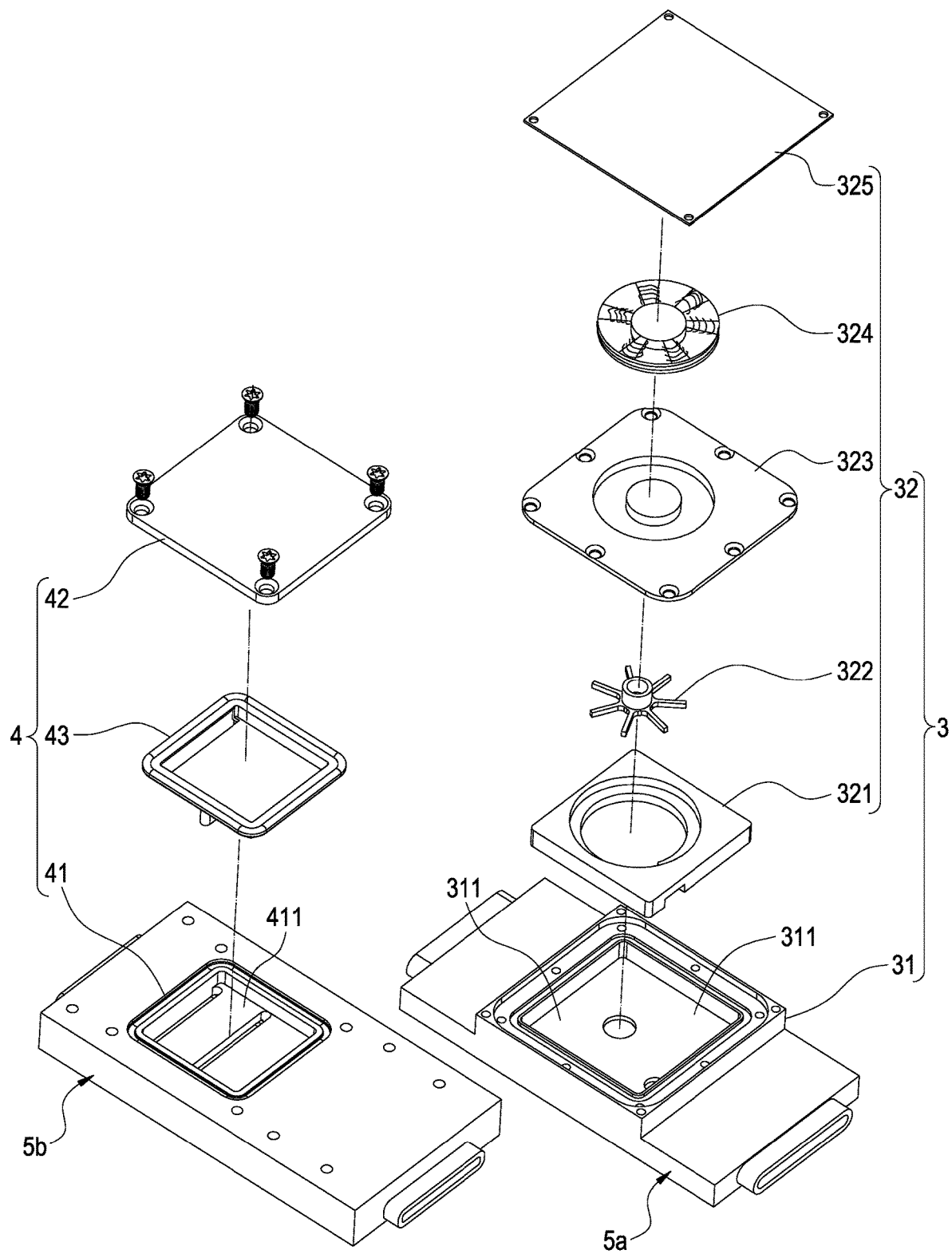
FIG. 4 is a partial exploded view showing a pumping structure, an endothermic structure and two bridges in accordance with the first embodiment of the present disclosure.

In FIG. 4, the water pump 32 comprises an inner cover 321, an impeller 322, a partition plate 323, a driving member 324 and an outer cover 325.

The endothermic structure 4 further comprises a sealing member 43 installed between the endothermic base 41 and the heat absorber 42 to provide a watertight effect.

Figure 8B:
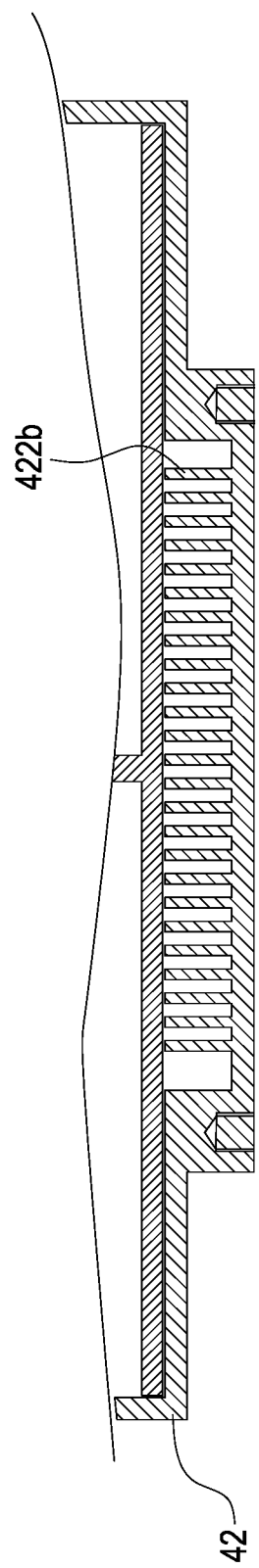
Figure 8C:
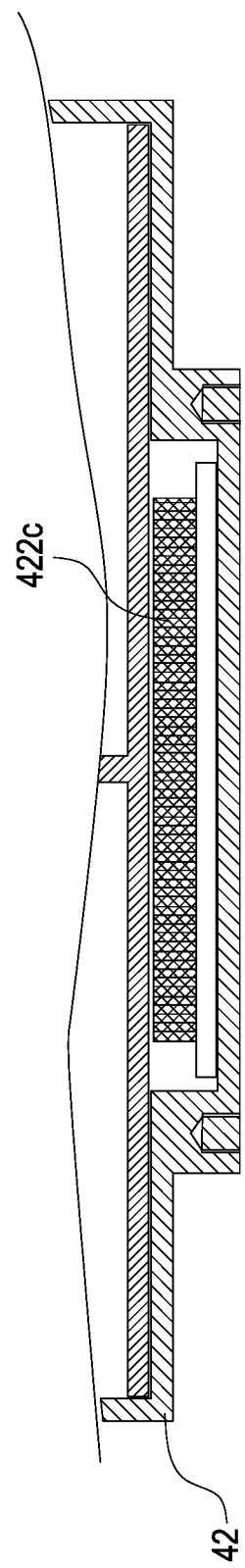

The heat absorber 42 is fixed to the endothermic base 41 by welding or screws. In an embodiment as shown in FIG. 8A, a welded portion 44 is welded and fixed between the endothermic base 41 and the heat absorber 42, and the heat absorber 42 comprises a heat absorbing plate 421 and a plurality of fins 422*a* welded onto a side of the heat absorbing plate 421*a*. In FIG. 8B, the fin 422*b* can be a prototype of the heat absorber 42. In FIG. 8C, the fin 422*c* is welded or screwed to an external structure of heat absorber 42.

Figure 9A:
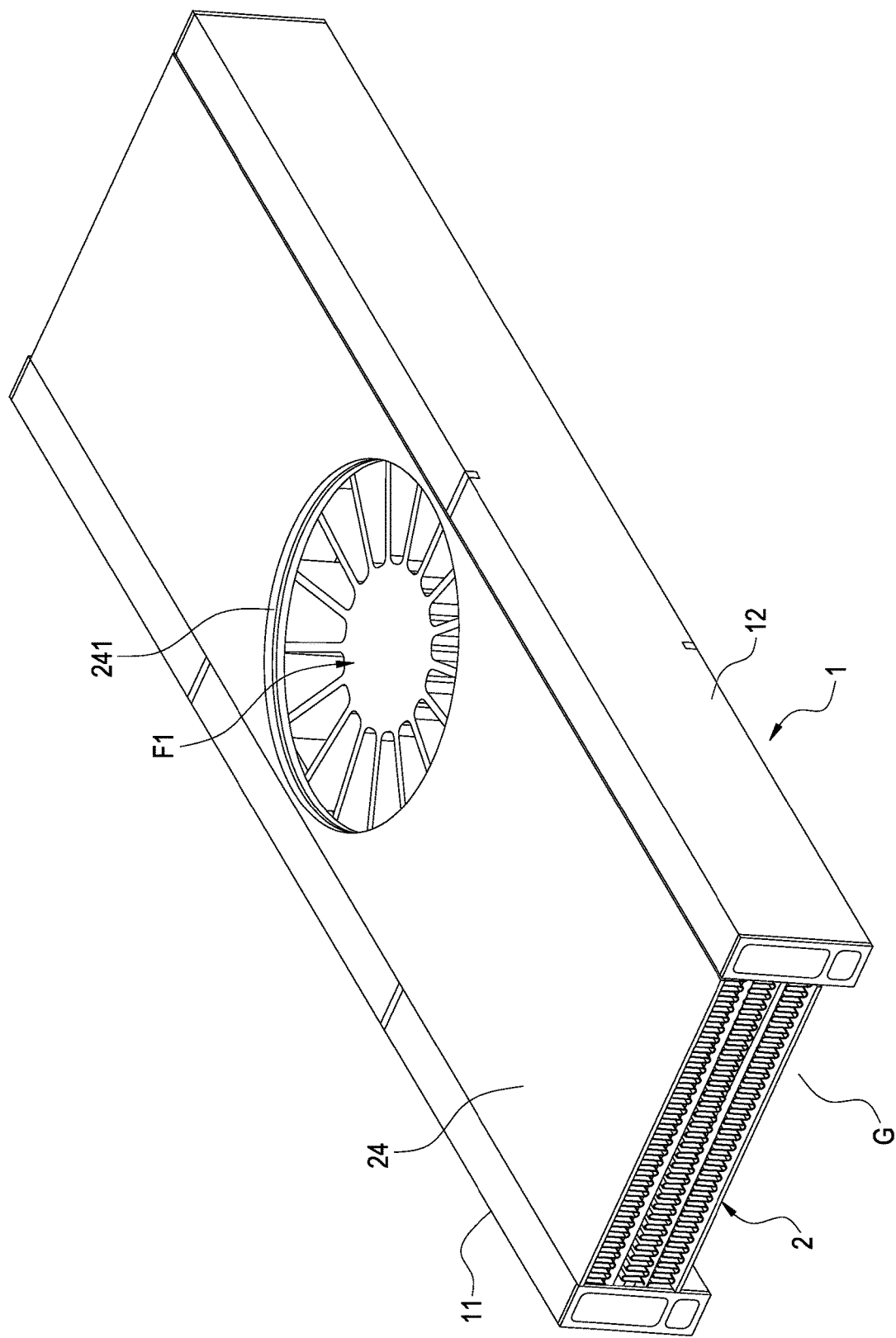
FIGS. 9A and 9B are schematic views showing a fan installed at different positions in accordance with the first embodiment of the present disclosure respectively.
Figure 9B:
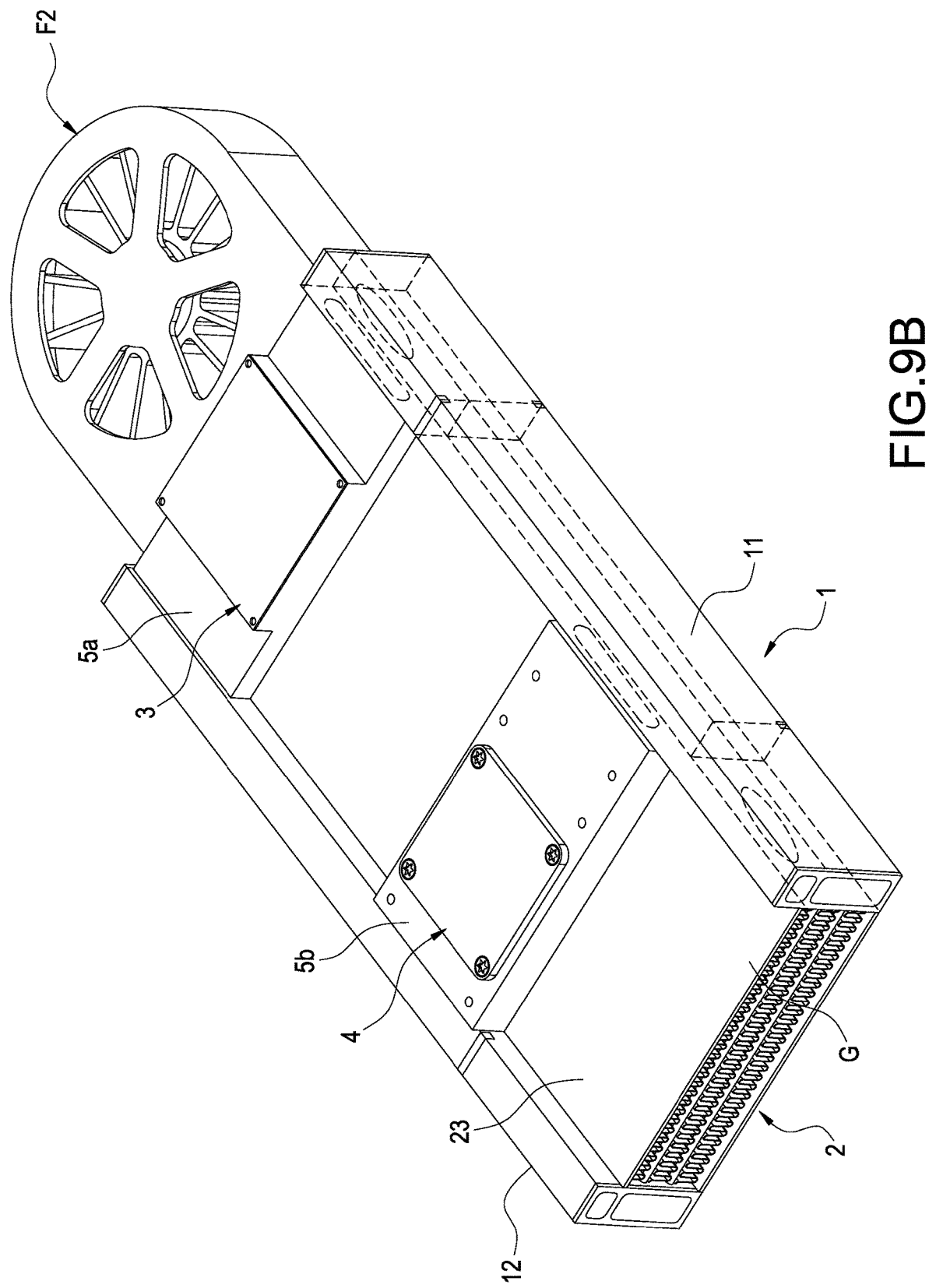

In FIGS. 9A and 9B, the liquid cooling device of the present disclosure further comprises a fan. In this embodiment, the fan is an axial flow fan F1 (as shown in FIG. 9A), and the fan F1 disposed on the opposite side of the pumping structure 3 and the endothermic structure 4 is embedded into the heat dissipation structure 2. In other words, the fan F1 is embedded from the other side of the heat dissipation structure 2, and the other side of the heat dissipation structure 2 (which is the bottom cover 24) has an air slot 241. In another embodiment, the fan is a vortex fan F2 (as shown in FIG. 9B), and the fan F2 is installed at an end of the heat dissipation structure 2. In other words, the fan F2 is installed on the other one of the two sides of the heat dissipation structure 2.

With reference to FIGS. 10A and 10B for a liquid cooling device in accordance with the second embodiment of the present disclosure, the second embodiment is substantially the same as the first embodiment except that the structure of the first bridge 5*a* and the second bridge 5*b* communicating to the water tank is different.

In FIG. 10A, two short adjacent pipes 6*a*, 6*b* are coupled between both ends of the first bridge 5*a* and the first water tank 11 and the second water tank 12, and two short adjacent pipes 6*c*, 6*d* are coupled between both ends of the second bridge 5*b* and the first water tank 11 and the second water tank 12.

In FIG. 10B, the two short adjacent pipes 6*a*, 6*b* are coupled between an end of the first bridge 5*a* and the second water tank 12, and the two adjacent pipes 6*c*, 6*d* are coupled between an end of the second bridge 5*b* and the second water tank 12.

It is noteworthy that the two adjacent pipes 6*a*, 6*b* or 6*c*, 6*d* of the aforementioned embodiments are made of a hard material including but not limited to metal.

With reference to FIG. 11 for a liquid cooling device in accordance with the third embodiment of the present disclosure, the third embodiment is substantially the same as the first embodiment except that the third embodiment substitutes the first bridge 5a and the second bridge 5b by a single bridge 5c.

The liquid cooling device of the third embodiment of the present disclosure comprises a bridge 5c with both ends coupled to the first water tank 11 and the second water tank 12, and the bridge 5c has a first port and a second port (not shown in the figure) arranged side by side with each other, and the pumping structure 3 is configured to be corresponsive to the first port by the water pump seat 31, and the endothermic structure 4 is configured to be corresponsive to the second port by the endothermic base 41.

With reference to FIG. 12 for a liquid cooling device in accordance with the fourth embodiment of the present disclosure, the fourth embodiment is substantially the same as the first embodiment except that there are a plurality of pumping structures 3 and a plurality of endothermic structures 4 in the fourth embodiment, wherein the pumping structures 3 are installed on the same first bridge 5a, and the endothermic structures 4 are installed on the second bridges 5b respectively.

Figure 13:
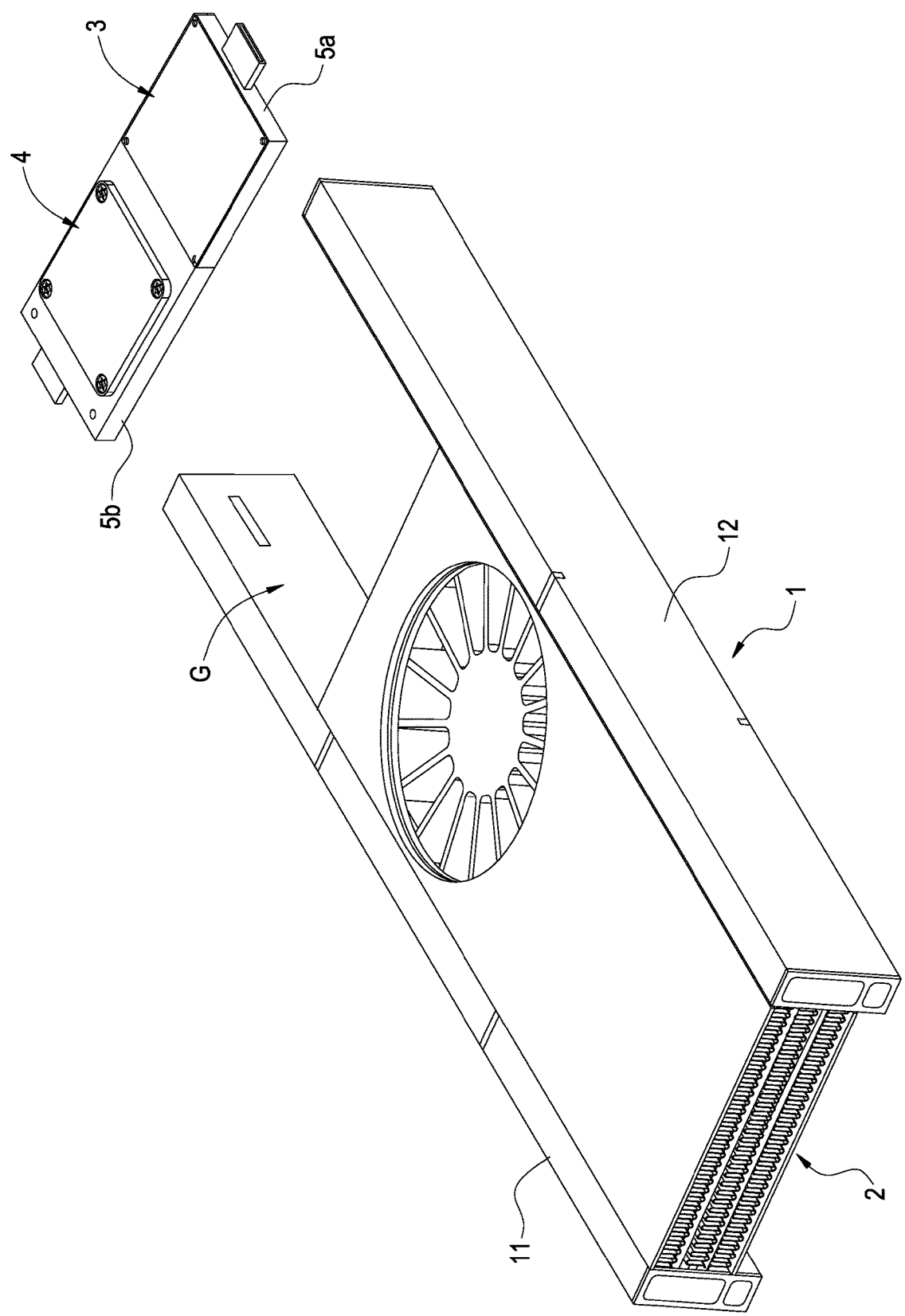
FIG. 13 is an exploded view of a liquid cooling device in accordance with a fifth embodiment of the present disclosure.

With reference to FIG. 13 for a liquid cooling device in accordance with the fifth embodiment of the present disclosure, the fifth embodiment is substantially the same as the first embodiment except the mounting portion G, first bridge 5a and the second bridge 5b.

In the fifth embodiment, the mounting portion G is formed between the inner side of the first water tank 11, the inner side of the second water tank 12, and an end of the heat dissipation structure 2. The first bridge 5a and the second bridge 5b are connected in series with each other and jointly coupled and coupled between the first water tank 11 and the second water tank 12. The pumping structure 3 and the endothermic structure 4 are installed at the first bridge 5a and the second bridge 5b respectively.

Figure 14:
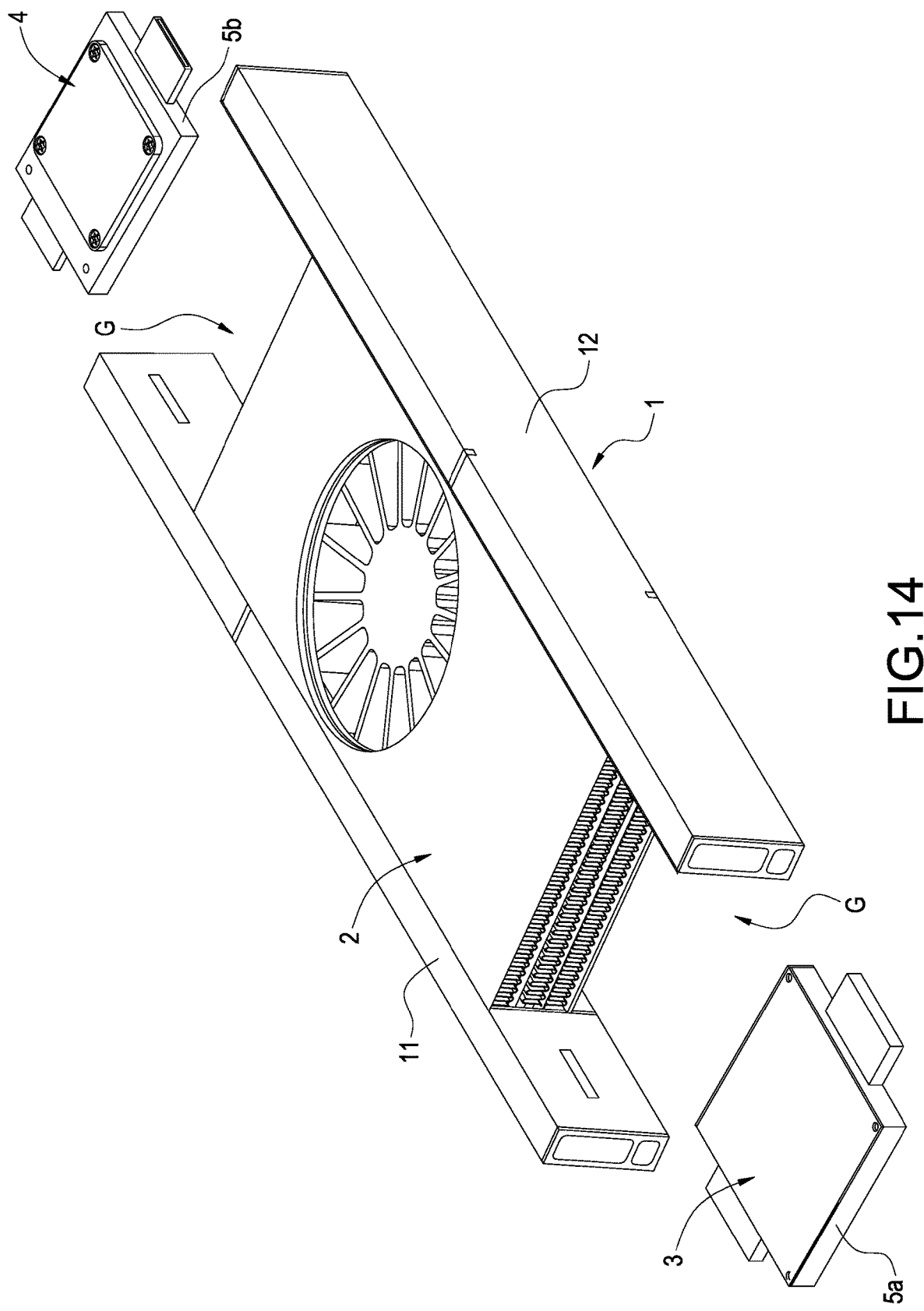
FIG. 14 is an exploded view of a liquid cooling device in accordance with a sixth embodiment of the present disclosure.

With reference to FIG. 14 for a liquid cooling device in accordance with the sixth embodiment of the present disclosure, the sixth embodiment is substantially the same as the first embodiment except that there are two mounting portions G in the sixth embodiment.

In the sixth embodiment, the two mounting portions G are formed between the inner side of the first water tank 11, the inner side of the second water tank 12 and both ends of the heat dissipation structure 2. The first bridge 5a and the second bridge 5b corresponding to each respective mounting portion G are coupled to the first water tank 11 and the second water tank 12 respectively. The pumping structure 3 and the endothermic structure 4 are installed at the first bridge 5a and the second bridge 5b respectively.

Figure 15:
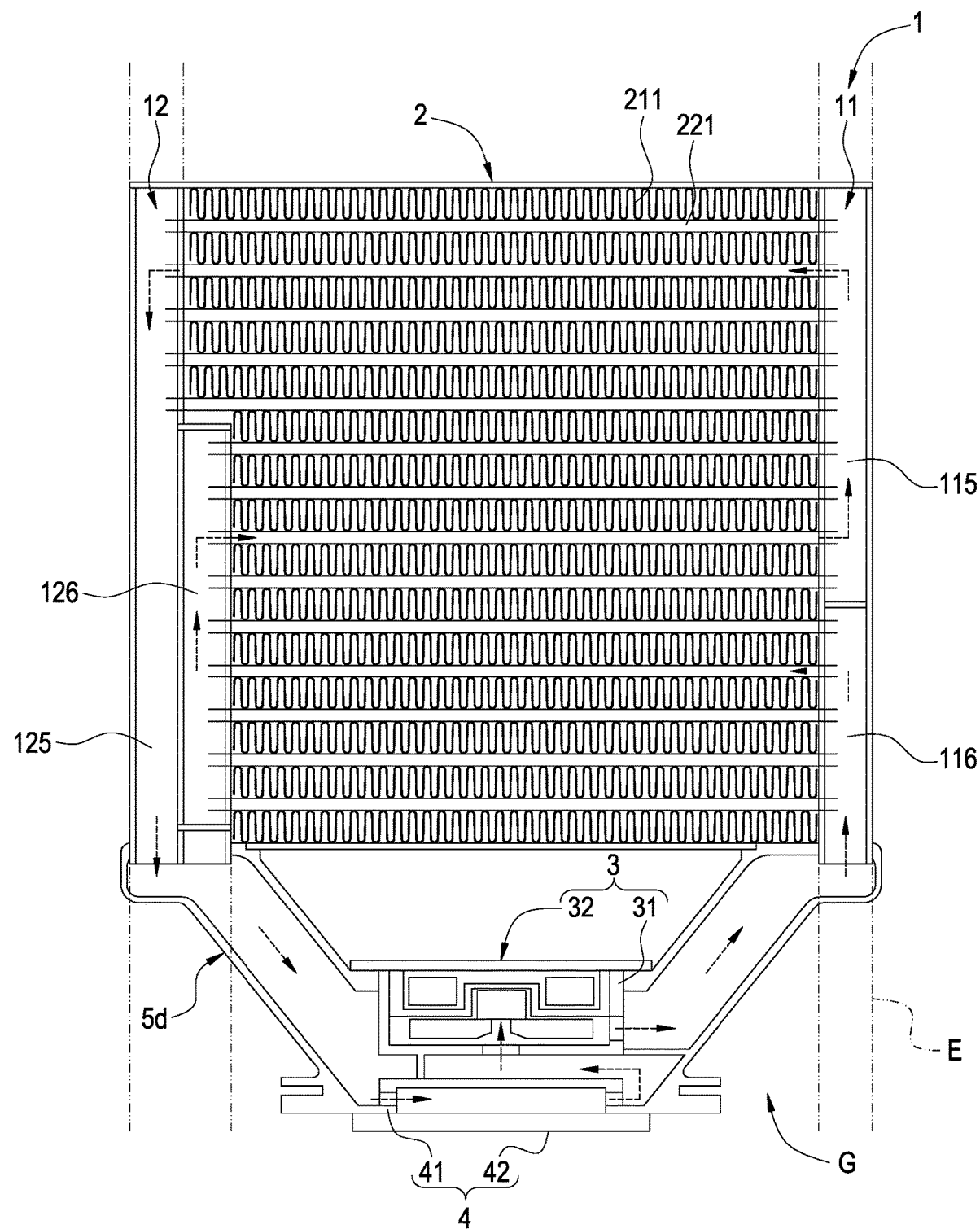
FIG. 15 is a cross-sectional view of a liquid cooling device in accordance with a seventh embodiment of the present disclosure.

With reference to FIG. 15 for a liquid cooling device in accordance with the seventh embodiment of the present disclosure, the seventh embodiment is substantially the same as the third embodiment (as shown in FIG. 11), except that the liquid cooling device of the seventh embodiment is a vertical liquid cooling device as described in details below.

The heat dissipation structure 2 is installed in the partitioned space 13 (as shown in FIG. 2) and coupled to the first water tank 11 and the second water tank 12 to form the curved cooling water passage, wherein the gap between the heat dissipation structure 2 and the first water tank 11 and the second water tank 12, and the heat dissipation structure 2 and the first water tank 11 and the second water tank 12 arranged side by side in an extension direction E jointly form the mounting portion G.

In this embodiment, the mounting portion G is formed at the first water tank 11, the second water tank 12 and the outer side of the bottom of the heat dissipation structure 2. It is noteworthy that the extension direction E of this embodiment refers to a range of the gap between the first water tank 11 and the second water tank 12 along a virtual extension direction, and the definition of this extension direction E is not limited to its use in this embodiment, but it can be applied to each of the aforementioned embodiments as well.

In FIG. 15, the pumping structure 3 is coupled to the first water tank 11 and the second water tank 12, so that the pumping structure 3 is coupled to the curved cooling water passage. The endothermic structure 4 is coupled to the first water tank 11 and the second water tank 12, so that the endothermic structure 4 is coupled to the curved cooling water passage.

Therefore, users can freely select the installation of the pumping structure 3 and the endothermic structure 4 to the bottom of the water tank structure 1 and the bottom of the endothermic structure 2 by using the bridge 5d to achieve the same effects of the third embodiment.

In the seventh embodiment, the liquid cooling device further comprises a bridge 5d, bridge 5d with both ends coupled to the bottom of the first water tank 11 and the bottom of the second water tank 12. It is noteworthy that the first water tank 11 and the second water tank 12 are coupled to both sides of the heat dissipation structure 2 respectively to form a cuboid, and the bridge 5d supports the bottom of the cuboid.

The bridge 5d has a first port and a second ports (which are not labeled in the figure) are stacked vertically with respect to each other, and the pumping structure 3 is configured to be corresponsive to and coupled to the first port by the water pump seat 31, and the endothermic structure 4 is configured to be corresponsive to and coupled to the second port by the endothermic base 41. The pumping structure 3 and the endothermic structure 4 are coupled to each other through the bridge 5d.

In addition, the first water tank 11 has an upper water chamber 115 and a lower water chamber 116 vertically stacked with respect to each other, and the second water tank 12 has a left water chamber 125 and a right water chamber 126 arranged side by side with each other. Wherein, the left water chamber 125 has a height equal to the height of the first water tank 11, and the right water chamber 126 is coupled to the upper water chamber 115 and the lower water chamber 116 through the heat dissipation structure 2.

Therefore, the pumping structure 3 can drive the working fluid curvedly flow back and forth between the plurality of water chambers of the first water tank 11 (which are the upper water chamber 115 and the lower water chamber 116), the plurality of fluid pipes 221 of the heat dissipation structure 2 and the plurality of water chambers of the second water tank 12 (which are the left water chamber 125 and the right water chamber 126) to form the curved cooling water passage.

In summation of the aforementioned embodiments, the present disclosure has another effect of providing different combinations and expanding the scope of application of the liquid cooling device with the cost of using the same mold. For example, different bridge designs including the use of the first bridge 5a and the second bridge 5b can be adopted according to the user requirements, or a signal bridge 5c, 5d can be used. In addition, the connecting position between each bridge and the first water tank 11 and the second water tank 12 can be changed according to the design requirement before the bridge and the first water tank 11 or the second water tank 12 are welded and fixed.

According to the aforementioned embodiments of the present disclosure, the present disclosure uses the heat dissipation structure 2, the pumping structure 3, and the endothermic structure 4 together with a free selection of components including the first bridge 5a, the second bridge 5b or different bridges 5c/5d to combine each component with the first water tank 11, the second water tank 12, or both directly, so that the process technology of the liquid cooling device of the present disclosure can avoid the risk of leakage caused by the use of long hoses and connectors for the connection, wherein this process technology relates to a welding process or a 3D printing process.

In summation, the present disclosure has the following advantageous effects:

1. The liquid cooling device is integrated into a structure with a smaller volume to facilitate its applications in a compact limited space.
2. The singularity of the major production processes can reduce the number of joints of the structure and components to reduce the risk of leaking significantly.
3. With the investment on the same set of mold, different combinations of the quantity and position of pumping structures and endothermic structures can be used to achieve the effects of expanding the scope of applications, saving costs, and improving the stability of quality.

While this disclosure has been described by means of specific embodiments, numerous modifications and variations could be made thereto by those skilled in the art without departing from the scope and spirit of this disclosure set forth in the claims.

What is claimed is:

1. A liquid cooling device, comprising:
   a water tank structure, having a first water tank and a second water tank for storing and dispatching a working fluid of the liquid cooling device;
   a heat dissipation structure, installed between the first water tank and the second water tank and coupled to each other to form a curved cooling water passage, and the heat dissipation structure being provided for exchanging heat absorbed by the working fluid with the outside to dissipate the heat;
   a mounting portion, formed at a gap between the heat dissipation structure and the first water tank and the second water tank, and the mounting portion is formed side by side with the heat dissipation structure, the first water tank and the second water tank in any direction;
   a pumping structure, fluidly coupled to the first water tank and the second water tank, and comprising a water pump and a water pump seat combined with each other; and
   an endothermic structure, disposed under the pumping structure, fluidly coupled to the first water tank and the second water tank, and comprising a heat absorber and an endothermic base combined with each other;
   a bridge with both ends coupled between the bottom of the first water tank and the bottom of the second water tank, the pumping structure and endothermic structure sandwiched in the bridge, and the bridge having a first port and a second port vertically stacked with respect to each other, and the first port located above the second port, and the water pump seat of the pumping structure communicating with the first port and the endothermic base of the endothermic structure communicating with the second port respectively;
   wherein, the bridge, the pumping structure and the endothermic structure are installed in the at least one mounting portion, and the pumping structure drives the working fluid to flow back and forth between the first water tank, the heat dissipation structure, the second water tank, the bridge, the second port, the endothermic base, the water pump seat, the first port, the bridge, and the first water tank sequentially in the curved cooling water passage,
   wherein the first water tank has an upper water chamber and a lower water chamber stacked vertically with respect to each other, and the second water tank has a left water chamber and a right water chamber disposed side by side with each other, and the left water chamber has a height equal to the height of the first water tank, and the right water chamber is coupled to the upper water chamber and the lower water chamber through the heat dissipation structure.

2. The liquid cooling device as claimed in claim 1, wherein the heat dissipation structure comprises a top cover, a row of fluid pipes, a plurality of cooling member rows and a bottom cover, and the row of fluid pipes comprises a plurality of fluid pipes parallel to each other, and each cooling member row comprises a plurality of fins, and both sides of the row of fluid pipes together with the top cover and the bottom cover are clamped in any manner.

* * * * *